United States Patent
Cok et al.

(10) Patent No.: US 7,833,074 B2
(45) Date of Patent: Nov. 16, 2010

(54) METHOD OF MAKING A TOP-EMITTING OLED DEVICE HAVING IMPROVED POWER DISTRIBUTION

(75) Inventors: Ronald S. Cok, Rochester, NY (US); Mitchell S. Burberry, Webster, NY (US); Donald R. Preuss, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 212 days.

(21) Appl. No.: 11/849,398

(22) Filed: Sep. 4, 2007

(65) Prior Publication Data

US 2009/0061724 A1   Mar. 5, 2009

(51) Int. Cl.
*H01J 9/00* (2006.01)
*B05D 5/12* (2006.01)

(52) U.S. Cl. .......................... 445/24; 427/66
(58) Field of Classification Search ................. 445/58; 438/99
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 6,468,819 B1 | 10/2002 | Kim et al. | |
| 6,995,035 B2 | 2/2006 | Cok et al. | |
| 2001/0011783 A1 | 8/2001 | Stecker | |
| 2001/0043046 A1 | 11/2001 | Fukunaga et al. | |
| 2002/0158835 A1 | 10/2002 | Kobayashi et al. | |
| 2005/0019977 A1* | 1/2005 | Prakash | 438/99 |
| 2005/0236981 A1* | 10/2005 | Cok et al. | 313/504 |
| 2007/0080356 A1 | 4/2007 | Nakayama et al. | |

FOREIGN PATENT DOCUMENTS

| | | |
|---|---|---|
| JP | 2007-103098 | 4/2007 |
| WO | WO 2005/057681 | 6/2005 |

OTHER PUBLICATIONS

U.S. Appl. No. 11/683,479, filed Mar. 8, 2007, Kahen.

* cited by examiner

*Primary Examiner*—Toan Ton
*Assistant Examiner*—Britt D Hanley
(74) *Attorney, Agent, or Firm*—Morgan Lewis & Bockius LLP (57) ABSTRACT

A method of making a top-emitting LED device, including providing, over a substrate, a laterally spaced and optically opaque lower electrode and an upper electrode buss that is electrically insulated from the lower electrode; depositing material forming an EL medium structure over the lower electrode and the upper electrode buss; depositing, over the EL medium structure, a first light-transmissive upper electrode that protects the EL medium structure from particulate contamination; and selectively removing most of the EL medium structure over a selective portion of the upper electrode buss.

16 Claims, 6 Drawing Sheets

METHOD OF MAKING A TOP-EMITTING OLED DEVICE HAVING IMPROVED POWER DISTRIBUTION

FIELD OF THE INVENTION

The present invention relates to top-emitting organic light-emitting diode (OLED) devices and, more particularly, to a method of making a top-emitting OLED device having improved power distribution in a light transmissive upper electrode.

BACKGROUND OF THE INVENTION

Light-emitting diode (LED) devices, also referred to as electroluminescent (EL) devices, have numerous well-known advantages over other flat-panel display devices currently in the market place. Among these advantages are brightness of light emission, relatively wide viewing angle, and reduced electrical power consumption compared to, for example, liquid crystal displays (LCDs) using backlighting. Such devices may be made with light-emitting layers comprising organic materials or inorganic materials such as quantum dots.

Applications of LED devices include active-matrix image displays, passive-matrix image displays, and area-lighting devices such as, for example, selective desktop lighting. Irrespective of the particular LED device configuration tailored to these broad fields of applications, all LEDs function on the same general principles. An electroluminescent (EL) medium structure is formed between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward biased. Positive charge carriers (holes) are injected from the anode into the EL medium structure, and negative charge carriers (electrons) are injected from the cathode. Such charge-carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light-transmissive electrode. If the light-transmissive electrode is between the substrate and the light-emissive elements of the LED device, the device is called a bottom-emitting LED device. Conversely, if the light-transmissive electrode is not between the substrate and the light-emissive elements, the device is referred to as a top-emitting LED device.

The EL medium structure can be formed of a stack of sublayers comprising organic materials that can include small-molecule layers and polymer layers. Such organic layers and sublayers are well known and understood by those skilled in the OLED art, for example U.S. Pat. No. 4,769,292, issued Sep. 6, 1988 to Tang et al., and U.S. Pat. No. 5,061,569, issued Oct. 29, 1991 to VanSlyke et al. Alternatively, inorganic materials may be employed to form the EL medium structure, for example including core\shell quantum dots formed in a polycrystalline, semiconductor matrix, for example, as taught in pending U.S. application Ser. No. 11/683,479, by Kahen.

Because light is emitted through an electrode, it is important that the electrode through which light is emitted be sufficiently light transmissive to avoid absorbing the emitted light. Typical prior-art materials used for such electrodes include indium tin oxide and very thin layers of metal. However, the current carrying capacity of electrodes formed from these materials is limited, thereby limiting the amount of light that can be emitted.

In conventional integrated circuits, bus connections are provided over the substrate to provide power to circuitry in the integrated circuit. These buses are located directly on the substrate or on layers deposited on the substrate, for example on planarization layers. In complex circuits, multiple levels of bus lines are located over the substrate and separated by insulating layers of material. For example, OLED displays sold by the Eastman Kodak Company utilize multiple bus lines located on the substrate and on various planarization layers. However, these buses are not useful to provide power to the light-transmissive upper electrode in an OLED device because conventional photolithography techniques destroy the organic layers and a typically thin upper electrode employed in a top-emitting OLED device.

U.S. Patent Application Publication 2002/0011783 A1 proposes to solve this problem by the formation of auxiliary electrodes in contact with the upper or top electrode. The auxiliary electrode may be either above or below the upper electrode. The auxiliary electrode has greater thickness and conductivity thereby increasing the current carrying capacity of the upper electrode. However, this approach has difficulties in that it reduces the light-emitting area of the OLED device and is difficult to manufacture. In particular, if the auxiliary electrode is formed before the organic elements are deposited, forming a good electrical contact between the upper and auxiliary electrodes is difficult, because the organic materials will be deposited on the auxiliary electrode. Moreover, undesirable moisture can infiltrate through materials at the corners of the auxiliary electrode and the conformal deposition of an additional upper electrode protection and encapsulation layer is problematic. If the auxiliary electrode is deposited above the upper electrode, a patterned deposition process is relatively difficult and liable to destroy both the upper electrode and the organic layers beneath it.

A second prior-art method to address this problem is to use an auxiliary electrode, as proposed by U.S. Patent Application Publication 2001/0043046 A1 by Fukunaga et al. entitled "Luminescent Apparatus and Method of Manufacturing the Same." However, this approach requires a complex multistep processing method and suffers from the above-described difficulties.

U.S. Patent Application Publication 2002/0158835 A1 by Kobayashi et al. entitled "Display Device and Method of Manufacturing the Same", discloses the use of auxiliary wiring elements which are electrically connected to a light transmissive second or upper electrode of an active matrix type planar display device. The auxiliary wiring elements are formed in the same layer or on the same surface as first or lower electrodes, and the auxiliary wiring elements are electrically insulated from the first electrodes. However, Kobayashi et al. provide no drawings describing process steps used in a method of making the device. Moreover, the electrical connection disclosed by Kobayashi et al. is formed between partition walls. The construction of suitable partition walls adds complexity to the process, reduces yields, adds cost, and limits the resolution of the interconnections.

The use of lasers and other techniques to form patterns in integrated circuits is known. For example, U.S. Pat. No. 6,468,819, entitled "Method for Patterning Organic Thin Film Devices Using a Die", describes the use of a die to form patterns and references the use of laser ablation to form patterns. U.S. Pat. No. 6,444,400, entitled "Method of Making an Electroconductive Pattern on a Support", likewise describes ablation, including the use of infrared lasers. Other patents, for example U.S. Pat. No. 6,433,355 issued Aug. 13, 2002, entitled "Non-Degenerate Wide Bandgap Semiconductors as Injection Layers and/or Contact Electrodes for Organic Electroluminescent Devices", also describe the use of laser ablation for patterning. However, none of these methods address problems with power distribution in a top-emitting LED device.

U.S. Pat. No. 6,995,035 entitled "Method of making a top-emitting OLED device having improved power distribution" by Cok and VanSlyke describes a method of making a top-emitting OLED device, includes providing over a substrate laterally spaced and optically opaque lower electrodes and upper electrode buses which are electrically insulated from the lower electrodes; depositing an organic EL medium structure over the lower electrodes and the upper electrode buses; selectively removing the organic EL medium structure over at least portions of the upper electrode buses to reveal at least upper surfaces of the upper electrode buses; and depositing a light transmissive upper electrode over the organic EL medium structure so that such upper electrode is in electrical contact with at least upper surfaces of the upper electrode buses. However, such a method tends to form particulate contamination when the organic EL medium structure is selectively removed. The particulate contamination may fall over the EL medium structure and inhibit current flow through the EL medium structure after a subsequent deposition of the light-transmissive upper electrode. This will cause unwanted dark spots.

There is a need therefore for an improved method and structure for providing enhanced power distribution to the transparent electrode of a top-emitting LED device.

SUMMARY OF THE INVENTION

A method of making a top-emitting LED device, including:
a) providing, over a substrate, a laterally spaced and optically opaque lower electrode and an upper electrode bus that is electrically insulated from the lower electrode;
b) depositing material forming an EL medium structure over the lower electrode and the upper electrode bus;
c) depositing, over the EL medium structure, a first light-transmissive upper electrode that protects the EL medium structure from particulate contamination; and
d) selectively removing most of the EL medium structure over a selective portion of the upper electrode bus.

It is therefore an object of the present invention to provide a method of making a top-emitting LED device having improved power distribution.

It is another object of the present invention to provide a method of making different classes of top-emitting LED devices having improved power distribution.

The drawings are necessarily of a schematic nature since layer thickness dimensions are frequently in the sub-micrometer ranges, while features representing lateral device dimensions can be in a range from 10 micrometers to several 100 micrometers. Accordingly, the drawings are scaled for ease of visualization rather than for dimensional accuracy.

DETAILED DESCRIPTION OF THE INVENTION

The present invention is directed to a method of making a top-emitting LED device. In top-emitting LED devices, light is emitted through an upper electrode or top electrode which has to be sufficiently light transmissive, while the lower electrode(s) or bottom electrode(s) can be made of relatively thick and electrically conductive metal compositions which can be optically opaque.

As used herein, the term "light transmissive" when referring to an upper electrode or top electrode of a top-emitting LED device denotes an optical transmission of 50% or more of light directed perpendicularly at a surface of such electrode. The term "optically opaque" refers to lower electrodes or bottom electrodes, upper electrode buses, bus connectors, and bus connector pads, and denotes an optical transmission of less than 50% of light directed perpendicularly at a surface of such electrically conductive elements.

The terms "pixel" and "subpixel" are generally used to designate the smallest addressable element of a display. For monochrome OLED displays there is no distinction between a pixel and a subpixel. In multicolor displays, or in full-color displays, a subpixel designates any portion of a pixel, which can be independently addressed to emit light of a specific color.

Figure 1:
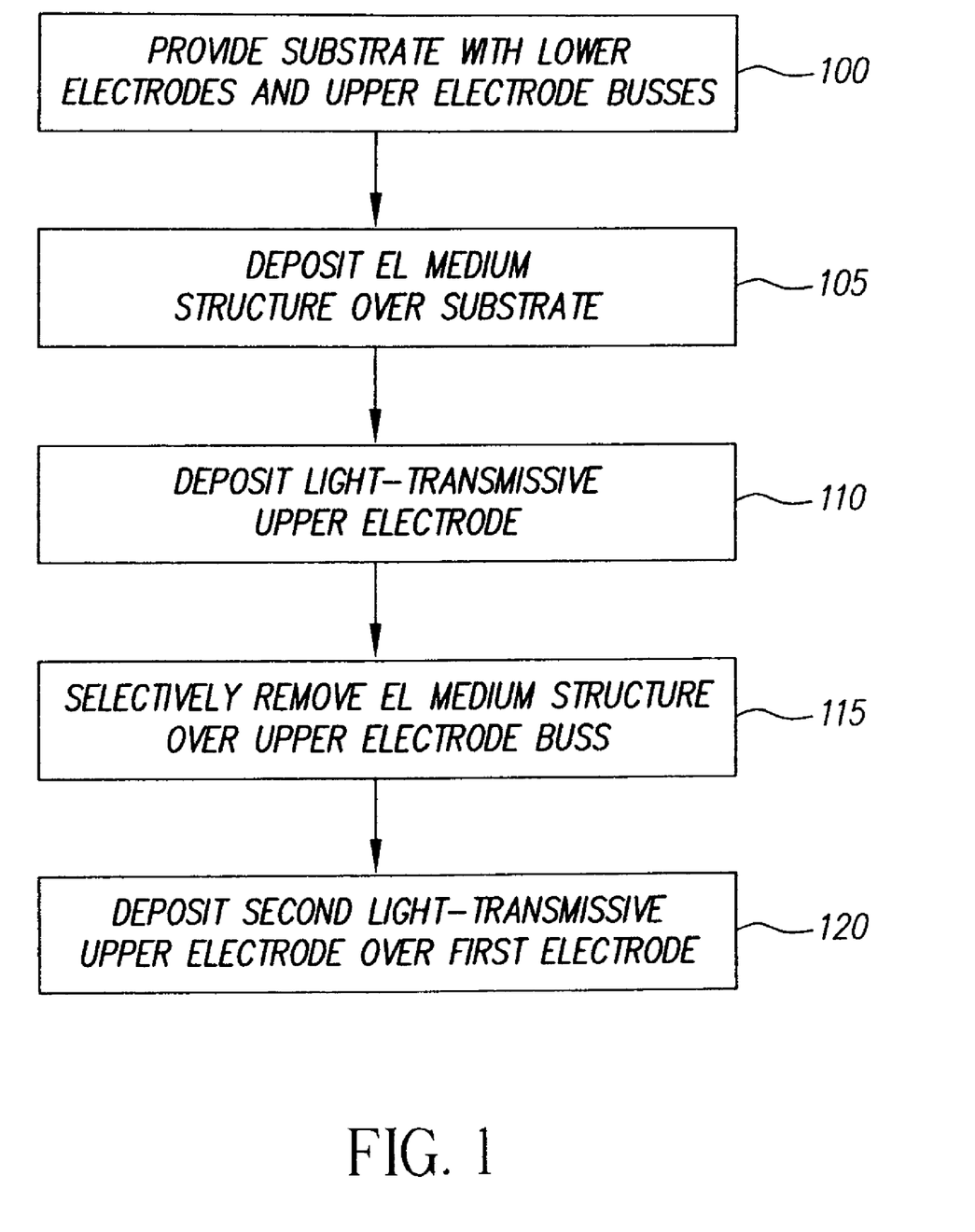
FIG. 1 is a flow diagram describing an embodiment of the method of the present invention.
Figure 2:
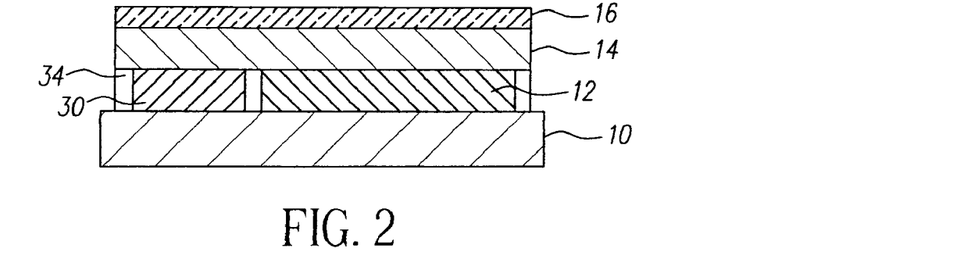
FIG. 2 is a schematic cross section of an LED device according to an embodiment of the present invention at a first step of construction.

Referring to FIGS. 1 and 2, a method of making a top-emitting LED device, comprises: operation 100, providing over a substrate 10, a laterally spaced and optically opaque lower electrode 12 and an upper electrode bus 30 that is electrically insulated from the lower electrode 12, operation 105 depositing material forming an EL medium structure 14 over the lower electrode 12 and the upper electrode bus 30, operation 110, depositing over the EL medium structure a first light-transmissive upper electrode 16 that protects the EL medium structure 14 from particulate contamination, and operation 115, selectively removing most of the EL medium structure 14 over selective portions of the upper electrode bus 30. In various embodiments of the present invention, a plurality of first light-transmissive upper electrodes 16 and upper electrode buses 30 may be provided. In a further embodiment, the method of the present invention includes the step of operation 120, depositing a second light-transmissive upper electrode 17, (shown in FIG. 5) over, and in direct electrical contact with, the first light-transmissive upper electrode 16, so that the second upper electrode 17 is in electrical contact with at least an upper surface of the upper electrode bus 30. In one exemplary embodiment of the present invention, the second light-transmissive upper electrode 17 is thicker than the first light-transmissive upper electrode 16.

Referring to FIGS. 2 through 5, an exemplary method of forming a top-emitting LED device is illustrated. Referring to FIG. 2, a substrate 10 is provided and a lower electrode 12 is formed on the substrate 10. An upper electrode bus 30 is also formed. Preferably, the lower electrode 12 is formed in a common, concurrent, manufacturing step with the upper electrode bus 30. An EL medium structure 14 such as a light-emitting layer, for example; comprising organic materials or inorganic materials such as quantum dots, is formed over the lower electrode 12 and the upper electrode bus 30. Other layers, for example, hole-injection, hole-transport, electron-injection, electron-transport, and charge blocking layers, may also be formed in layer 14. Such layers may be formed by evaporation or solution coating methods known in the art. A first light-transmissive upper electrode 16 is then formed over the EL medium structure 14. Light-transmissive upper electrode 16 may comprise, for example, indium tin oxide (ITO) deposited with a sputtering technique. Light-transmissive layer 16 is relatively thin, for example one nm thick, but less than 100 nm thick.

Figure 3:
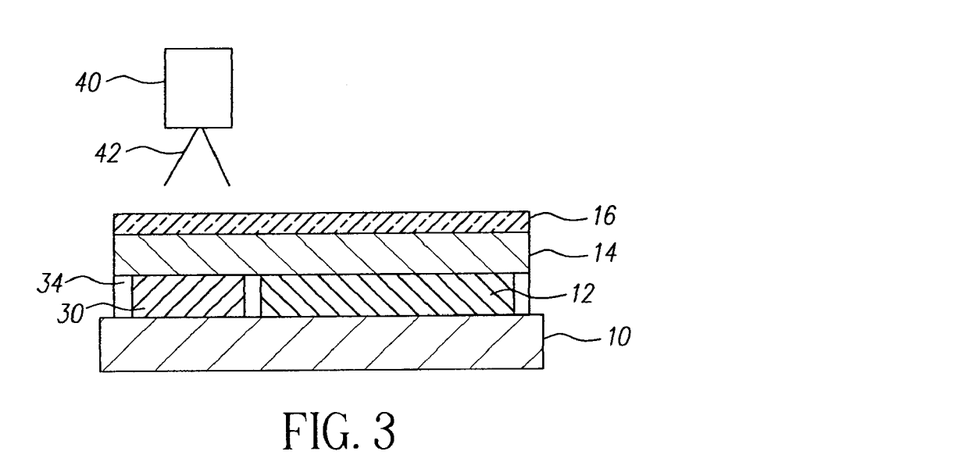
FIG. 3 is a schematic cross section of an LED device according to an embodiment of the present invention at a second step of construction.
Figure 4:
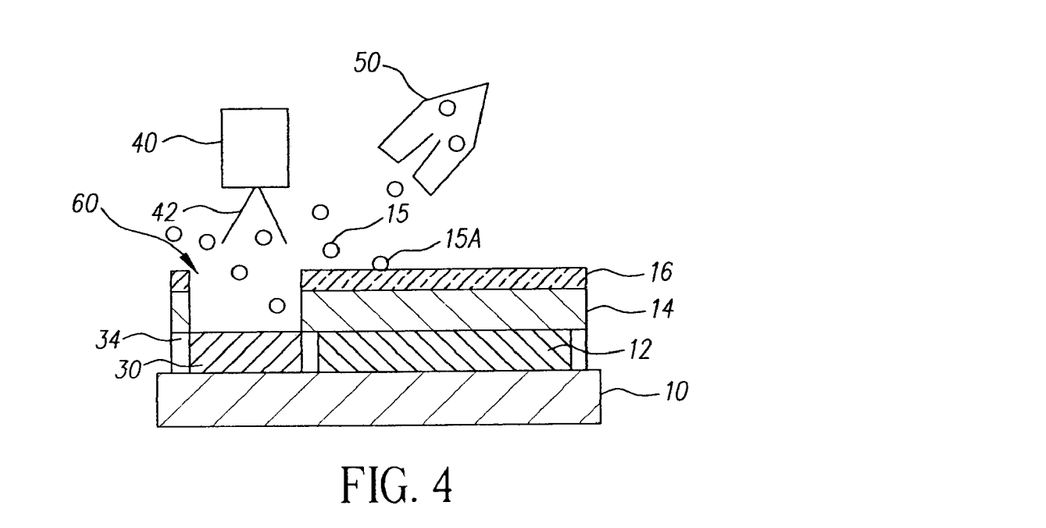
FIG. 4 is a schematic cross section of an LED device according to an embodiment of the present invention at a third step of construction.

Initially, referring to FIG. 3, once the initial top-emitting LED structure is formed, a portion of the EL medium structure 14 over the upper electrode bus 30 is selectively removed with a laser 40 to form a via 60 (shown in FIG. 4) for example by laser ablation. Laser ablation processes are known in the prior art. Referring to FIG. 4, a laser 40 emitting a laser beam 42 locally heats and vaporizes the EL medium structure 14, forming vaporized or ablated particles 15. Some vaporized particles 15A redeposit on the LED device. In a prior-art method described in U.S. Pat. No. 6,995,035 entitled, "Method of making a top-emitting OLED device having improved power distribution" by Cok and VanSlyke referenced above and hereby included in its entirety by reference, vaporized particles 15A can re-deposit on the EL medium structure 14 in the absence of the light-transmissive upper electrode 16. Such re-deposition can damage the EL medium structure (particularly, if organic EL materials are employed) and can also prevent current from flowing through the EL medium structure as desired, resulting in dark spots (i.e., areas of reduced or no light emission in the LED device). As taught in the prior art, a particulate contamination removal system 50 may be employed to reduce the level of particulate contamination, but cannot wholly prevent such contamination. Hence, according to the present invention, the light-transmissive upper electrode 16 provides protection to the EL medium structure by preventing re-deposition of particles 15A on the EL medium structure 14. Moreover, the light-transmissive upper electrode 16 can provide some environmental protection to the underlying layers during the ablation process. Furthermore, particles 15A that do re-deposit over the light-transmissive upper electrode 16 will not inhibit the flow of current through the EL medium structure 14, since current can be conducted along the plane of the light-transmissive upper electrode 16, and not only orthogonally through it.

The light-transmissive upper electrode 16 is relatively thin to enable selective removal of the EL medium structure over portions of the upper electrode buses 30, while still providing adequate protection to the EL medium structure from particulate contamination 15A. However, such a thin electrode may not be sufficiently conductive to provide adequate current for all LED devices such as a display. Hence, in a further embodiment of the present invention, the operation of selectively removing the EL medium structure 14 also selectively removes the first light-transmissive upper electrode 16 over at least portions of the upper electrode buses 30 to reveal at least upper surfaces of the upper electrode buses 30 (see FIG. 1). Subsequently, operation 120 (also depicted in FIG. 1) deposits a second light-transmissive upper electrode 17 (FIG. 5) over the first light-transmissive upper electrode 16 in the portions where the EL medium structure 14 is not selectively removed so that such second upper electrode 17 is in electrical contact with at least upper surfaces of the upper electrode buses 30 and provides additional current-carrying capacity to the upper electrode 18 of the LED device.

Figure 5:
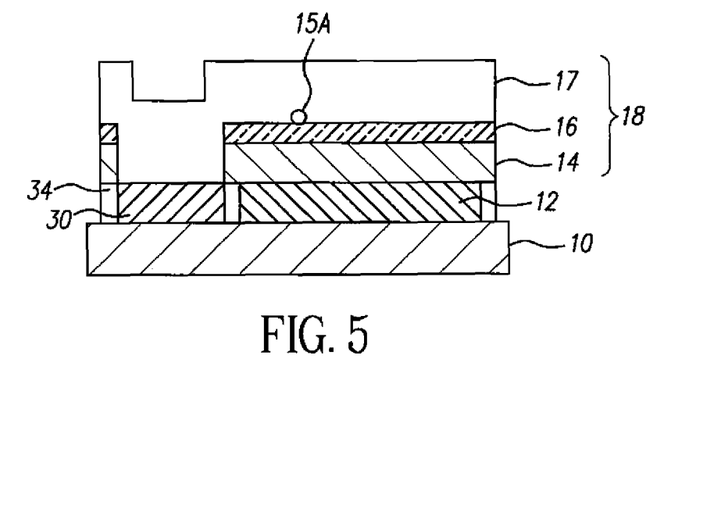
FIG. 5 is a schematic cross section of an LED device according to an embodiment of the present invention at a fourth step of construction.

In one exemplary embodiment of the present invention illustrated in FIG. 5, the second upper electrode 17 is thicker than the first upper electrode 16. The thinner, first upper electrode 16 provides adequate protection to the EL medium structure 14 from particulate contamination that might cause either or both chemical or electrical damage to the EL medium structure 14. At the same time, the thinner, first upper electrode 16 is thin enough to enable selective ablation of selected portions of the EL medium structure 14 and/or selected portions of the first upper electrode 16. The thicker, second upper electrode 17 provides additional current-carrying capacity (not explicitly shown). The thinner, upper electrode 16 may be, for example, 10 nm thick while the thicker, upper electrode 17 may be, for example, 100 nm thick.

The light-transmissive upper electrodes 16 and 17 may be formed from transparent conductive oxides, for example, ITO or aluminum zinc oxide and may be deposited by sputtering or by chemical vapor or atomic layer deposition methods as taught in the art.

Figure 6:
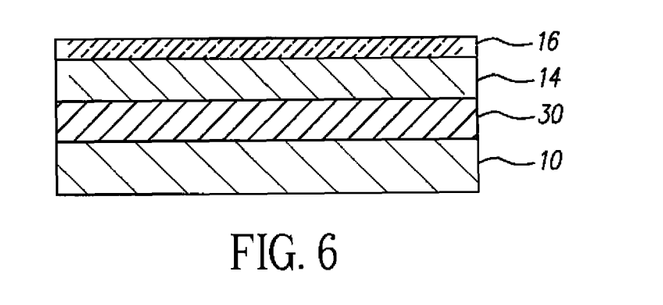
FIG. 6 is a schematic cross section of an LED device according to another embodiment of the present invention at a first step of construction.

In an alternative embodiment, operation 115 selectively removes the EL medium structure 14 over at least portions of the upper electrode buses 30 and causes the first light-transmissive upper electrode 16 to become in electrical contact with at least upper surfaces of the upper electrode buses 30. Since the EL medium structure 14 is very thin (e.g. less than 100 nm thick) and the area over which the layer is formed relatively large (e.g. 100 microns), even a small amount of flexibility in the first light-transmissive upper electrode 16 can cause the first light-transmissive upper electrode 16 to become in electrical contact with at least upper surfaces of the upper electrode buses 30. In this embodiment (referring to FIG. 6, an LED device structure includes a substrate 10, an upper electrode bus 30 formed on substrate 10, and an EL medium structure 14 formed over the upper electrode bus 30. A first light-transmissive upper electrode 16 is formed over the EL medium structure 14. (For greater clarity, a lower electrode is not shown in FIGS. 6, 7, and 8).

Figure 7:
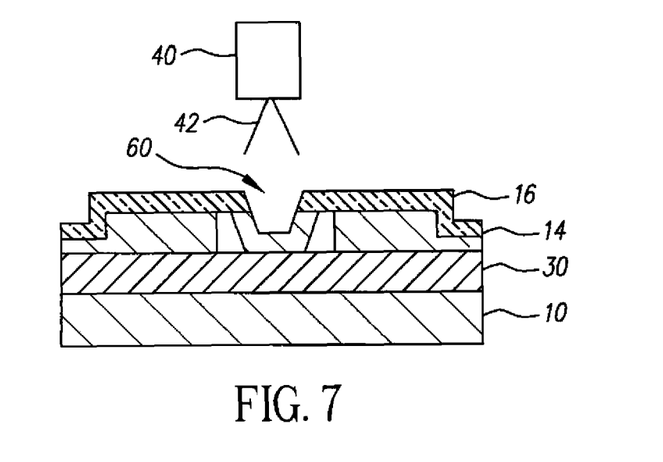
FIG. 7 is a schematic cross section of an LED device according to another embodiment of the present invention at a second step of construction.

Referring to FIG. 7, a laser 40 employs a laser beam 42 to heat the EL medium structure 14 and cause it to flow. By flow, in this context is meant that the materials in the EL medium structure 14 do not form vaporized gaseous particles, but rather are subjected to surface energy effects that cause the materials to move over the surface of the upper electrode bus 30; for example, creating a coffee-ring effect in which the material forms an open space in the center of the via 60 and greater amounts of material are present at the periphery of the via 60. Applicants have demonstrated: i) the use of localized heat and surface energy effects to flow organic materials out of a selected area and ii) forming a suitable via. In this exemplary embodiment, the EL medium structure 14 is contained between the first light-transmissive upper electrode 16 and the upper electrode buses 30 when the EL medium structure 14 is selectively removed. Lower temperatures may be employed to cause the materials to flow over a surface (e.g. upper electrode bus 30), while higher temperatures may cause the materials to vaporize (as shown in FIG. 4).

Figure 8:
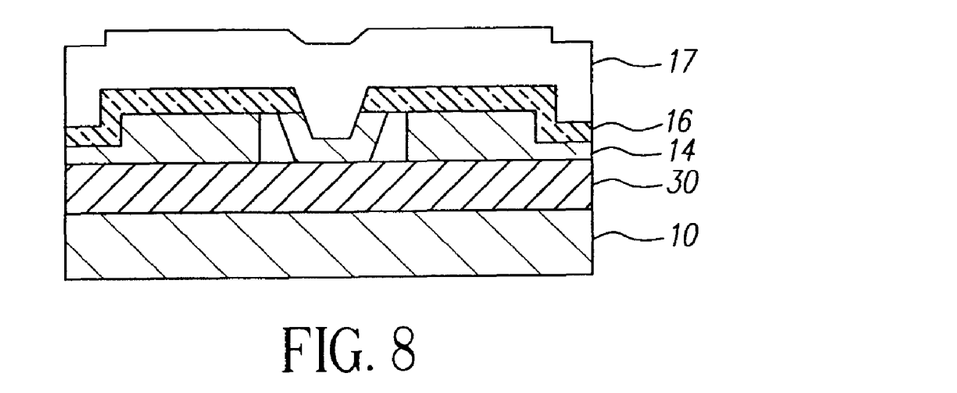
FIG. 8 is a schematic cross section of an LED device according to another embodiment of the present invention at a third step of construction.

Referring to FIG. 8, a second light-transmissive upper electrode 17 may optionally be formed over the first light-transmissive upper electrode 16. However, in this alternative embodiment, the first light-transmissive upper electrode 16 may be much thicker (e.g. 100 nm thick) and a second light-transmissive upper electrode 17 may not be necessary.

Figure 9:
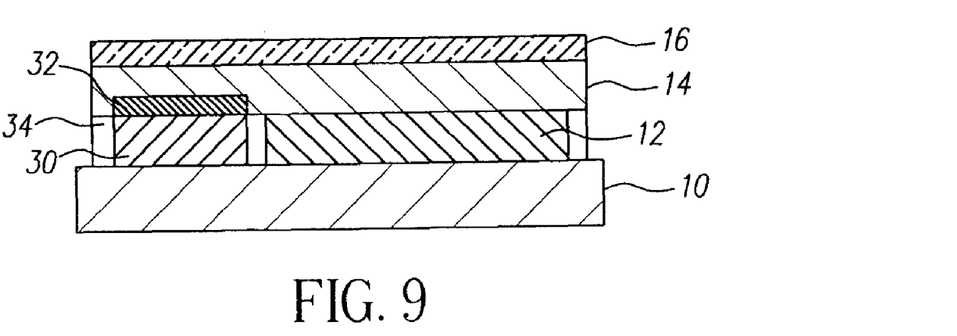
FIG. 9 is a schematic cross section of an LED device according to yet another embodiment of the present invention at a first step of construction.

Referring to FIG. 9, in yet another alternative embodiment of the present invention, a heat-absorbing element 32 may be formed over or under the EL medium structure 14 in the area where the EL medium structure 14 is selectively removed. Such a heat-absorbing element 32 can be formed on the upper electrode bus 30 and may be electrically conductive or black. Applicants have demonstrated the formation and use of such a heat-absorbing element 32, for example, by employing metals or metal oxides such as chromium.

Figure 10:
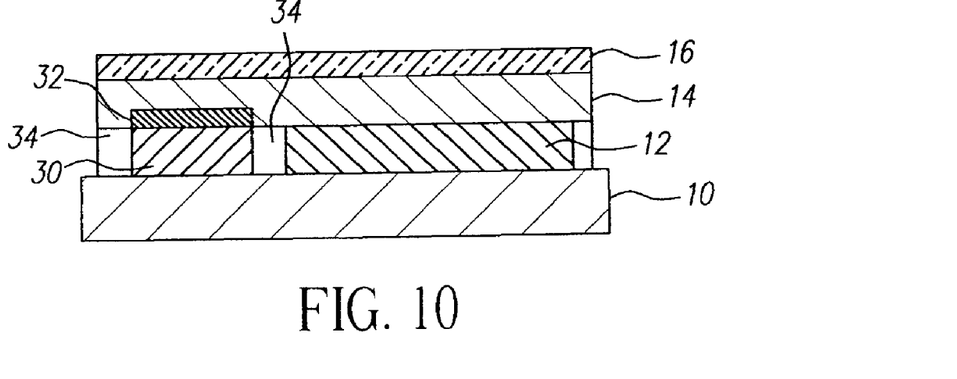
FIG. 10 is a schematic cross section of an LED device according to an alternative embodiment of the present invention at a first step of construction.
Figure 12:
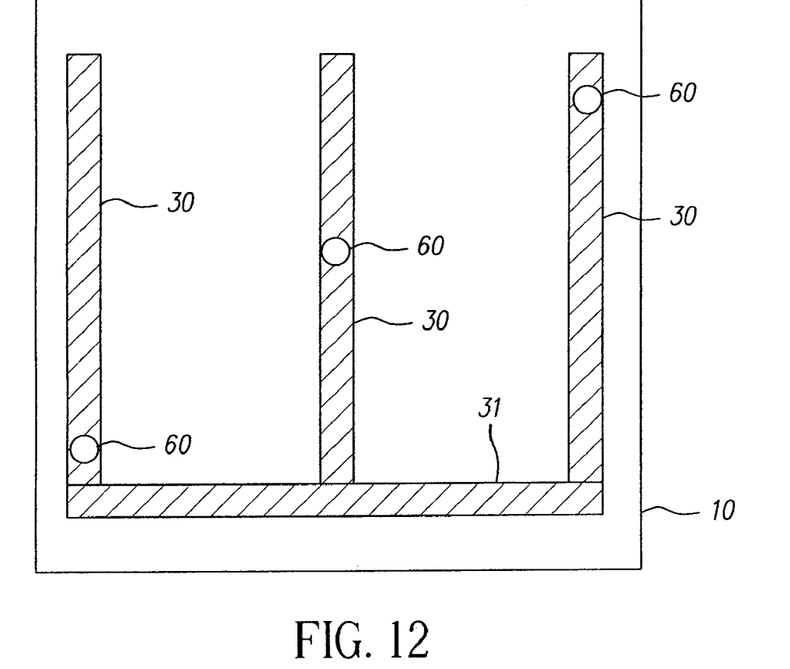
FIG. 12 is a schematic, top-view diagram of an LED device according to an embodiment of the present invention.

Referring to FIG. 10, in other embodiments of the method of the present invention, electrically insulating material 34 are provided between each one of the upper electrode buses 30 and adjacent lower electrodes 12. Furthermore, as shown in FIG. 12 in a top view, a common electrical connection 31 may be provided between all of the upper electrode buses 30, so that a single electrical connection to a power supply may be employed. In addition, a common electrical connection may be provided between all of the lower electrodes so that a single electrical connection to a power supply may likewise be employed (not shown).

Figure 11:
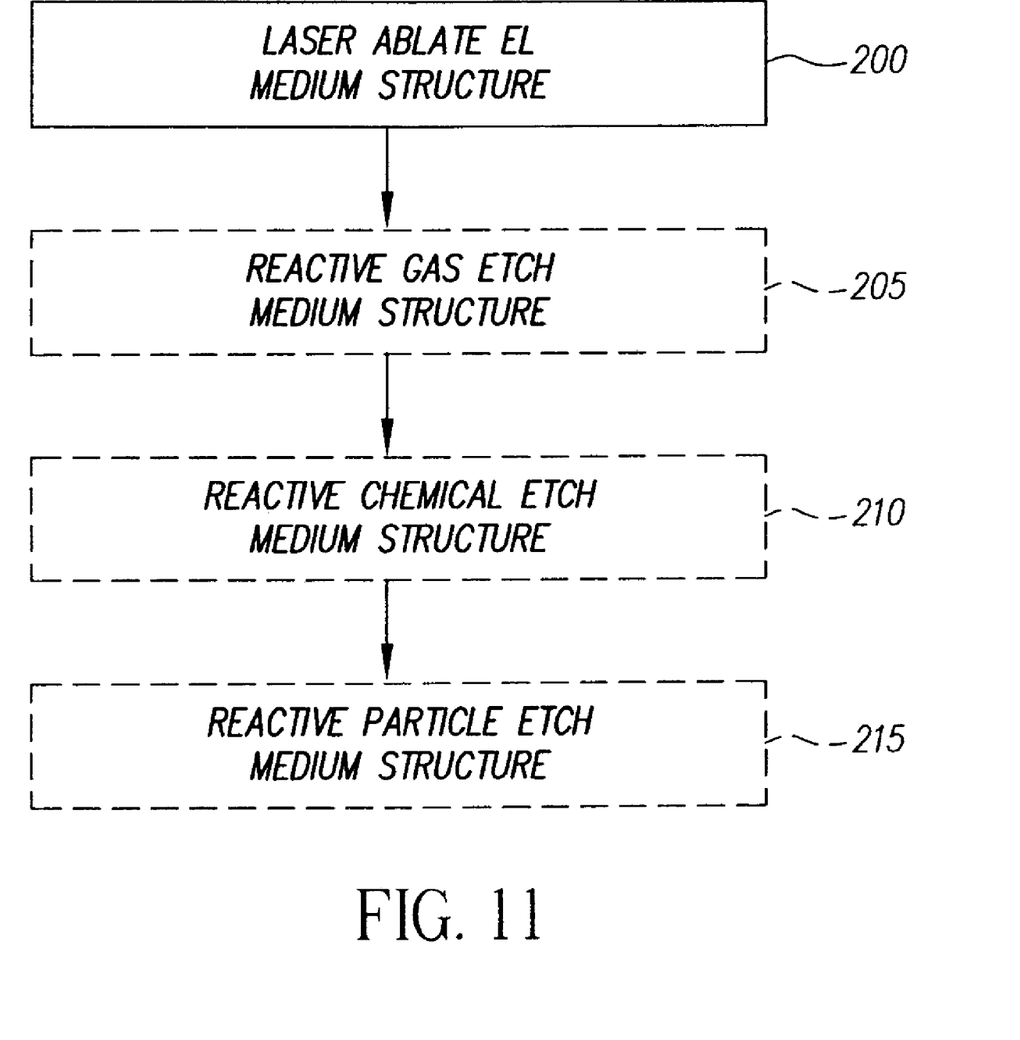
FIG. 11 is a flow diagram describing another embodiment of the method of the present invention.

Referring to FIG. 11, in other alternative embodiments of the method of the present invention, removal of the EL medium structure may include one or more of the steps of heating (operation 200), exposure to a reactive gas (operation 205), exposure to a reactive chemical (operation 210), and exposure to reactive particles (operation 215). Such methods for etching materials or performing materials removal are known in the art. Mechanical means such as a particle removal system employing a vacuum may be used to reduce particle contamination.

In accordance with various embodiments of the present invention, the method further includes the steps of making a top-emitting passive- or active-matrix LED device, or an organic or inorganic LED device.

Useful electrically insulative substrates 10 include glass substrates, quartz substrates, plastic substrates, ceramic substrates, and substrates having an electrically insulative surface layer provided over an otherwise electrically conductive substrate body.

The lower electrodes 12, and the upper electrode buses 30 may be made of a metal, a metal alloy, or of a multilayer metal sandwich, and are formed at a thickness (not indicated in the drawings) selected to provide sufficiently high electrical conductivity, long-term physical and chemical stability, and adhesion to the substrate 10 surface. Additionally, the selection of a metal has to be viewed in terms of a propensity to inject positive charge carriers (holes) into an EL medium structure 14. A metal having a work function $\geq 4.0$ eV is considered to have acceptable hole-injecting propensity. Hole-injecting propensity can be improved by providing a hole-injecting layer (not shown) over the lower electrodes 12 (for a configuration in which the lower electrodes 12 are anodes). Particularly useful materials for forming a hole-injecting layer include conductive metal oxides such as, for example, indium-tin oxide (ITO), phthalocyanine compounds such as, for example, copper phthalocyanine, and plasma-deposited fluorocarbon materials (CFx).

In view of the above considerations, particularly useful metals include silver, gold, platinum, iridium, tantalum, tungsten, molybdenum, nickel, and aluminum, or selected alloys, or sandwich structures of such metals.

Various known methods can be chosen to provide the pattern of the lower electrodes 12, the upper electrode buses 30, bus connectors and bus connector pads (not shown). Among such known methods are printing, vapor deposition through a pattern mask, vapor deposition of a pattern defined by a photoresist pattern in a so-called "lift-off" process, and patterning a uniformly deposited layer by selective etching via a photoresist etch mask.

The thickness of the patterned metal features renders them optically opaque. Upper surfaces can be optically reflective, with a level of reflectivity determined by choice of metal or metals and by micro-topological aspects of the upper surface.

As indicated in FIG. 10, electrical insulation 34 is formed between the lower electrodes 12 and the upper electrode buses 30 so that upper surfaces (not identified) of the buses are revealed. The electrical insulation can be an organic photoresist material, which has been patterned by a photolithographic process.

The EL medium structure can be a multilayer structure, which includes, in sequence, a hole-injecting layer, a hole-transporting layer, a light-emitting layer, an electron-transporting layer, and an electron-injecting layer. Such multilayer structures are well known in the art of designing and making organic and inorganic LED devices. The EL medium structure can include small molecule layers and polymer layers, as well as quantum dots formed in a common layer, for example such as a polycrystalline, semiconductor matrix.

If the top-emitting LED device is designated to be a monochrome light-emitting device, one and the same EL medium structure is formed over all lower electrodes 12, electrical insulation 34, and upper electrode buses 30, and any heat-absorbing layer 32.

If the top-emitting LED device is designated to be a multicolor device or a full-color device, the light-emitting layer of the EL medium structure is deposited selectively over selected lower electrodes 12. For example, a red light-emitting layer may be formed over some lower electrodes 12 and may extend laterally over adjacent electrical insulation 34. Green and blue light-emitting layers may be formed similarly. The light-emitting layers may overlap or abut over the insulation 34 or over the upper electrode buses 30. All other layers of the multilayer organic EL medium structure are commonly deposited over all lower electrodes, upper electrode buses, and electrical insulation.

Figure 13:
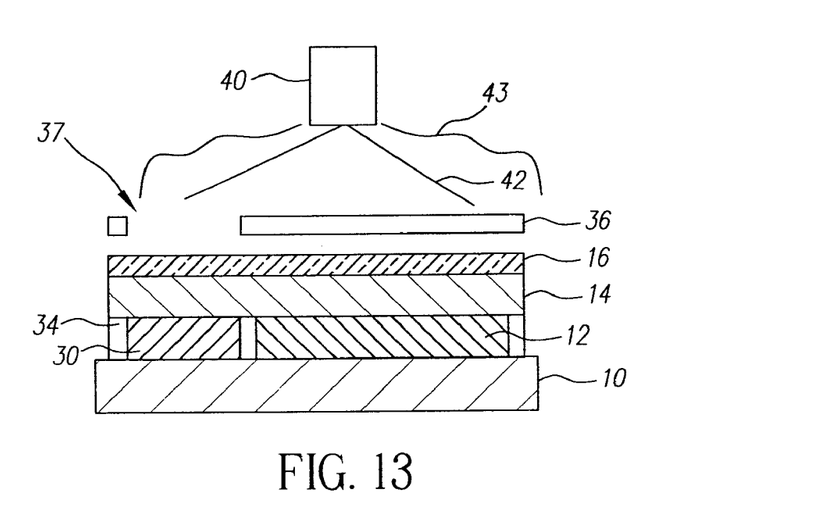
FIG. 13 is a schematic cross section of an LED device according to an alternative embodiment of the present invention at a second step of construction.

Selective removal of the EL medium structure 14 may occur by selectively ablating the structure via laser beam 42, which is selectively directed at zones or areas from which the EL medium structure 14 is to be removed. Preferably, this ablative process is carried out in a chamber (not shown) held at reduced pressure. It will be appreciated that the process of ablation may include resublimation of materials (particularly organic), which may have been originally deposited by a sublimation process. Selectively ablating portions of the EL medium structure 14 can be accomplished by directing the laser beam 42 (e.g. a linear array of solid-state laser diodes)

towards the upper electrode buses 30, and by providing relative motion between the laser light beams 42 and the substrate 10 and upper electrode buses 30. Referring to FIG. 13, selective portions of the EL medium structure 14 can also be ablated by providing a source of uniform radiation 43 directed towards the EL medium structure 14, and by providing a mask 36 between the source and the EL medium structure 14, with the mask 36 having mask openings 37 which are oriented with respect to the upper electrode buses 30 so that the mask openings 37 correspond to the location of the upper electrode buses 30. Thus, the uniform radiation 43 is defined by openings 37 in a mask 36. Alternatively, selectively ablating portions of the EL medium structure 14 can be achieved by directing one or more laser light beams 42 towards the structure 14 in registration with the upper electrode buses 30.

The use of laser beams 42 and of other techniques of forming patterns in integrated circuits is well known. For example, U.S. Pat. No. 6,468,819 describes the use of a die to form patterns, and references the use of laser ablation to form patterns. U.S. Pat. No. 6,444,400 discloses ablation, including the use of infrared lasers. U.S. Pat. No. 6,433,355 describes laser ablation for patterning semiconductor injection layers and/or contact electrodes for OLED devices. However, these publications do not disclose or suggest selectively removing an EL medium structure 14 during the fabrication of an LED device to create a via 60 for connecting a transparent electrode 16 to an opaque bus line 30.

The light-transmissive upper electrode 18 can be formed of a thin metal film or of a layer of relatively transparent and electrically conductive metal oxides, or a combination of these materials. An electron-injecting interfacial layer, for example a lithium fluoride (LiF) interfacial layer, may be formed as an uppermost layer of the EL medium structure 14, followed by a layer of aluminum (Al). In combination, layers of these materials comprise the light transmissive upper electrode 18, as described, for example, in U.S. Pat. No. 5,677,572. Other useful upper electrode material sets include, but are not limited to, those disclosed in U.S. Pat. Nos. 5,059,861 and 5,059,862. The term transparent as used in this specification includes materials, which pass sufficient light to permit the LED device to operate effectively as a top-emitter. For example, alternative thin films of transparent electrode material useful for the present invention include indium tin oxide (ITO) in combination with an electron-injecting layer or alloys of a low-work function material with other metals or alloys, for example, Li/Ag, LiF/Al/Ag, and alloys of magnesium with other metals (such as MgAg, MgAl, MgSn, MgIn, or MgZn, with or without an additional layer of Ag or any other highly conductive metals or alloys).

Optically transparent electrodes have been described in more detail in U.S. Pat. Nos. 4,885,211; 5,247,190; JP 3,234,963; U.S. Pat. Nos. 5,703,436; 5,608,287; 5,837,391, 5,677,572; 5,776,622; 5,776,623; 5,714,838; 5,969,474; 5,739,545; 5,981,306; 6,137,223; 6,140,763, 6,172,459; EP 1 076 368; and U.S. Pat. Nos. 6,278,236 and 6,284,393. A transparent electrode is typically deposited by evaporation, sputtering, or chemical vapor deposition. When needed, patterning can be achieved through many well known methods including, but not limited to, through-mask deposition, integral shadow masking, for example, as described in U.S. Pat. Nos. 5,276,380 and 6,221,563, and EP 0 732 868, by laser ablation, and by selective chemical vapor deposition.

The electrical contact between the light-transmissive upper electrode 16,17 and each one of the metallic upper electrode buses 30 provides for improved power distribution within the upper electrode 16,17, thereby permitting the use of substantially light transmissive materials in forming the upper electrode 18. Stated differently, undesirable voltage drops along or across a light transmissive upper electrode 16, 17 can be substantially reduced or avoided by providing multiple electrical connections between such electrode and metallic, electrically conductive upper electrode buses 30.

Upper electrode buses 30 can extend laterally along or across an entire LED device and may be disposed in spaces between laterally spaced lower electrodes 12. Each one of the upper electrode buses 30 is in electrical contact with the common light transmissive upper electrode 16,17 to provide improved uniformity of current distribution or of power distribution in this common upper electrode.

In the foregoing description, the process sequence of forming lower electrodes 12 and upper electrode buses 30, depositing an organic EL medium structure 14 over all features of a partial device, selectively removing the EL medium 14 from the upper electrode buses 30, and forming a common light transmissive upper electrode 18 in electrical contact with the buses, permits a simplified method of making different classes of top-emitting LED devices which have improved power distribution.

Selective Removal of EL Medium Structure

As described previously, selective removal may be accomplished, for example by laser ablation. One or more linear arrays of lasers, arranged in an integrated circuit, can be translated over the surface of the LED device, wherein the linear array is aligned with respect to the upper electrode buses 30 from which EL medium structure 14 is removed. Alternatively, the LED device can be translated with respect to a stationary linear array of lasers 40.

Another method of selectively removing EL material includes using an optical mask 36 having openings 37 which are aligned with respect to the upper electrode buses, and directing a flood exposure of laser light 42 or light from another light source through the openings onto the device surface, so that EL material is ablated at the same time from all upper electrode buses 30.

A further method of selectively removing EL material includes using one or more lasers configured to independently ablate EL material from upper electrode buses, and from other areas peripheral to light-emitting areas of an LED device.

The EL medium structure 14 is relatively thin (for example, less than 100 nm) and is readily selectively removed. The structure is relatively transparent, but absorbs light or energy at selected wavelengths. The upper electrode buses 30 are typically made of a metal, metal alloy, or of a sandwich configuration of metals, and as such exhibit a level of optical reflectivity. Due to this reflectivity, the ablation process is stopped at the upper electrode buses 30, thus preventing ablation beyond the removal of the EL medium structure 14.

The invention has been described in detail with particular reference to certain preferred embodiments thereof, but it will be understood that variations and modifications can be effected within the spirit and scope of the invention. It will be understood that the method of the present invention may be applied to different classes of OLED devices such as polymer OLED devices (either active- or passive-matrix), top-emitting passive matrix OLED devices, and top-emitting active-matrix OLED devices.

PARTS LIST 10 substrate
12 lower electrode
14 EL medium structure 15, 15A vaporized particle
16 first light-transmissive upper electrode
17 second light-transmissive upper electrode
30 upper electrode bus
31 common electrical connection
32 heat-absorbing layer
34 electrical insulator layer
36 mask
37 mask openings
40 laser
42 laser beam
43 uniform radiation
50 particle removal system
60 via
100 Provide substrate operation
105 Deposit EL operation
110 Deposit first upper electrode operation
115 Selective removal operation
120 Deposit second upper electrode operation
200 laser ablation operation
205 reactive gas etching operation
210 reactive chemical etching operation
215 reactive particle etching operation

What is claimed is:

1. A method of making a top-emitting LED device, comprising:
   a) providing, over a substrate a laterally spaced and optically opaque lower electrode and an upper electrode bus that is electrically insulated from the lower electrode;
   b) depositing material forming an EL medium structure over the lower electrode and the upper electrode bus;
   c) depositing, over the EL medium structure, a first light-transmissive upper electrode that protects the EL medium structure from particulate contamination;
   d) selectively removing the first light-transmissive upper electrode and most of the EL medium structure over a selective portion of the upper electrode bus; and
   e) depositing a second light-transmissive upper electrode over and in direct electrical contact with the first light-transmissive upper electrode so that such second upper electrode is in electrical contact with at least an upper surface of the upper electrode bus.

2. The method of claim 1, wherein the step of selectively removing reveals at least upper surfaces of the upper electrode bus.

3. The method of claim 1, wherein the second light-transmissive upper electrode is thicker than the first light-transmissive upper electrode.

4. The method of claim 1 wherein the step of selectively removing the EL medium structure over a selective portion of the upper electrode bus causes the first upper electrode to become in electrical contact with at least an upper surface of the upper electrode bus.

5. The method of claim 1 wherein the step of selectively removing the EL medium structure includes ablating the material of the EL medium structure.

6. The method of claim 5 wherein the material of the EL medium structure is heated to ablate the material.

7. The method of claim 6 wherein the step of heating is done by localized exposure to a laser beam.

8. The method of claim 1 wherein the material of the EL medium structure is contained between the first light-transmissive upper electrode and the upper electrode bus when the EL medium structure is selectively removed.

9. A method of making a top-emitting LED device, comprising:
   a) providing, over a substrate, a laterally spaced and optically opaque lower electrode and an upper electrode bus that is electrically insulated from the lower electrode;
   b) depositing material forming an EL medium structure over the lower electrode and the upper electrode bus;
   c) depositing, over the EL medium structure, a first light-transmissive upper electrode that protects the EL medium structure from particulate contamination;
   d) selectively removing the first light-transmissive upper electrode and most of the EL medium structure over a selective portion of the upper electrode bus;
   e) forming a heat-absorbing element over or under the EL medium structure in the area where the EL medium structure is to be selectively removed; and
   f) wherein the heat-absorbing element is formed on the upper electrode bus.

10. The method of claim 1 wherein the step of selectively removing the EL medium structure includes one or more of the steps of: heating, exposure to a reactive gas, exposure to a reactive chemical, mechanically removing particles, and exposure to reactive particles.

11. The method of claim 1 wherein the lower electrode and the upper electrode bus are concurrently formed.

12. The method of claim 1 further including providing electrically insulating material between the upper electrode bus and the lower electrode.

13. The method of claim 1 further including providing a common electrical connection to the upper or lower electrode.

14. The method of claim 1 further comprising:
   i) providing a laser-light beam directed towards the upper electrode bus; and
   ii) providing relative motion between the laser-light beam and the upper electrode bus deposited over the substrate.

15. The method of claim 1 further including:
   i) providing a source of uniform radiation directed towards the EL medium structure; and
   ii) providing a mask between the source and the EL medium structure and having mask openings corresponding to the location of the upper electrode bus.

16. The method of claim 9 wherein the heat-absorbing element is electrically conductive or black.

* * * * *